United States Patent [19]

Do-Thoi et al.

[11] Patent Number: 5,156,322

[45] Date of Patent: Oct. 20, 1992

[54] PROCESS FOR THE PRODUCTION OF A SOLDER COATING ON METALLIZED MATERIALS

[75] Inventors: Tha Do-Thoi, Röthenbach; Klaus Popp, Nürnberg, both of Fed. Rep. of Germany

[73] Assignee: Hoechst CeramTec Aktiengesellschaft, Selb, Fed. Rep. of Germany

[21] Appl. No.: 713,588

[22] Filed: Jun. 11, 1991

Related U.S. Application Data

[63] Continuation of Ser. No. 382,892, Jul. 20, 1989, abandoned.

[30] Foreign Application Priority Data

Jul. 22, 1988 [DE] Fed. Rep. of Germany ....... 3824900

[51] Int. Cl.$^5$ ............................................. B23K 1/20
[52] U.S. Cl. ................................. 228/124; 228/198; 228/254; 427/404; 428/671
[58] Field of Search .................. 228/124, 254, 263.12, 228/198; 428/671; 427/404

[56] References Cited

U.S. PATENT DOCUMENTS

| | | | |
|---|---|---|---|
| 2,667,427 | 1/1954 | Nolte | 228/124 X |
| 3,006,069 | 10/1961 | Rhoads et al. | 228/124 |
| 3,055,465 | 9/1962 | Pulfrich | 228/263.12 X |
| 3,560,172 | 2/1971 | Kench et al. | 428/671 X |
| 3,683,488 | 8/1972 | Cook et al. | 228/254 X |
| 4,624,897 | 11/1986 | Ito | 428/671 X |

*Primary Examiner*—Kenneth J. Ramsey
*Attorney, Agent, or Firm*—Foley & Lardner

[57] ABSTRACT

A solder coating is applied to a metallized ceramic part in that at least two layers, in each case composed of nickel, copper, silver, zinc or tin, are applied chemically or galvanically. Under the soldering conditions molten solder metal forms on these layers. Useful layers for hard solders are those which are in each case composed of Ni, Cu or Ag. For example, a layer of nickel, copper or silver, with a layer thickness of at least 0.5 μm, can be first applied to the metallized ceramic part, followed by at least one further layer of nickel, copper or silver with a layer thickness of 10–105 μm, until a total layer thickness of 15–300 μm is obtained.

17 Claims, No Drawings

PROCESS FOR THE PRODUCTION OF A SOLDER COATING ON METALLIZED MATERIALS

This application is a continuation of application Ser. No. 07/382,892, filed July 20, 1989, now abandoned.

The present invention relates to a process for applying a solder, especially a hard solder, to metallized ceramics using chemical or galvanic deposition processes.

The object of providing a gas-tight bond with good adhesion between metal parts (especially metal electrodes made of copper, niobium or steel) and insulating ceramic parts (especially aluminum oxide) occurs especially in the production of electronic components (surge arresters, thyristor housings, vacuum switching tubes). This object is usually achieved by a multistage process. In the first stage the ceramic surfaces to be bonded to the metal are first metallized by the classic molybdenum/manganese or tungsten/titanium metallizing process. The resultant thin metallic layer (2–30 $\mu$m) is baked in a moist, reducing atmosphere at temperatures of 1200° C. to 1500° C. In this manner good adhesion is achieved between the ceramic substrate and the metallizing layer. A nickel or copper coating is usually subsequently applied to the metallizing layer either galvanically or chemically. The nickel or copper coating is about 0.5 to 5 $\mu$m thick and its sole object is to allow wetting of the metallized ceramic material by the molten solder. In the next operation the components to be soldered are mounted in a graphite soldering jig. A disk of solder (based on silver/copper for example) is placed on the metallized ceramic surface. The metal part to be bonded to the ceramic part is placed on the disk of solder and exactly centered with the aid of the soldering jig. The soldering jig including the ceramic part, the metal part and the disk of solder is heated at temperatures between 750° C. and 1200° C. in a protective gas atmosphere or in vacuo. At the soldering temperature the metal and the ceramic surfaces are wetted by the molten solder. The solder, solidified after cooling, acts as a gas-tight bond with good adhesion between the metal and ceramic parts. The electronics industry often employs silver/copper alloys as hard solder. The melting point of this solder can be varied in the region from 780 (eutectic) to about 1070° C. (pure copper), depending on the amount by weight of copper present in the alloy.

The chemical and physical properties (thermal expansion) of the hard solder material must be adjusted to suit the metallizing layer of the ceramic part and the properties of the metal part. The melting point of the solder (single-substance system or eutectic) or the melting range (multi-substance system) must be within the range of the permissible processing temperature.

The drawback of this process, practiced for many decades, is the fact that the adjustment of the solder parts (for example the disks of solder) in the assembly operation is highly labor-intensive and requires manual dexterity. It is not possible to automatize the assembly. This is particularly true for geometrically complicated soldering positions or for objects with several soldering positions. The problem is made even more serious by the fact that the electronics industry frequently requires small components made of metallized ceramics in large unit numbers.

A process has now been found which overcomes this drawback and in which the solder is applied to the metallized ceramic part without the use of heat. This process comprises a single layer, but preferably at least two layers, comprising in each case nickel, tin, zinc, copper or silver, being applied galvanically or chemically to the metallized ceramic part. The resultant coating preferably has a total thickness of 15 to 300 $\mu$m, in particular 15 to 150 $\mu$m. In this process the individual elements are deposited successively. The longer the exposure time, or the greater the current density and the concentration of the bath, the larger the layer of the deposited element. Soldering then results, according to the chosen conditions (temperature, duration) in the formation of a liquid phase, in a more or less intensive mixing of the layers, and in the formation of a more or less homogeneous alloy. Total thicknesses of over 150 $\mu$m are possible but less advantageous than low thicknesses (costs of material and labor) with at least equally good adhesion.

At least one layer each of tin, zinc, copper and silver is preferably applied to the metallized ceramic part, the amount of tin being not more than 10 % by weight (based on the total of the applied layer). The order of application is not critical.

For soldering steel, copper or nickel, alloys containing 30 to 55 % by weight of silver, 22 to 36 % by weight of copper, 18 to 32 % by weight of zinc and 2 to 5 % by weight of tin are employed (cf. DODUCO data sheet, "Typen-ÜbersichtHartlote·Weichlote·Flussmittel"['-'Survey of types of hard solders, soft solders and fluxes"], section "Cadmiumfreie Lote" ["Cadmium-free solders"], solder Nos. 8855, 8845, 8838, 8834 and 8830).

In another embodiment of the invention, tin is omitted. Here the applied coating is composed of at least one layer each of copper, silver and zinc. Alloys of these elements are usually employed for the soldering of silver, silver alloys, steel, copper, nickel and nickel alloys (cf. DODUCO data sheet, section "Cadmiumfreie Lote"["Cadmium-free solders"], for example solder Nos. 8075 to 8830).

In a preferred embodiment of the invention, a layer of nickel, copper or silver is first applied to the metallized ceramic part in a thickness of at least 0.5 $\mu$m, followed by at least one further layer of nickel, copper or silver in a layer thickness of 10 to 150 $\mu$m, so that the total layer has a thickness of 15 to 300 $\mu$m. The total thickness of the applied layers is preferably not more than 150 $\mu$m, in particular 30 to 100 $\mu$m. The individual layers of copper and silver preferably have thicknesses of 5 to 60, in particular 6 to 50 $\mu$m. For example, it is possible first to apply a layer of copper or nickel having a thickness of 0.5 to 5 $\mu$m, followed by three thicker layers of silver, of nickel and of copper which together have a thickness of 15 to 150 $\mu$m.

Many variants are possible in this process, depending on which metal forms the layer first applied. If this metal is nickel, the thickness of this layer should be 0.5 to not more than 5 $\mu$m. At least one further layer of copper or silver in a layer thickness of 1 to 150 $\mu$m, in particular of 1 to 70 $\mu$m, is applied to this layer, the total thickness of the applied layers being 16 to 160 $\mu$m. The purpose of the nickel is essentially to improve the adhesion of the subsequent layers to the metallized ceramic part.

The idea of providing metallized ceramics with thin layers of nickel or copper in order that the solder metal later adheres better to the metallized ceramics, is already known. According to U.S. Pat. No. 2,667,427, nickel is deposited first, followed by copper, if a silver solder is used. However, the deposited amounts cannot replace the solder.

It is also possible first to apply a thin layer of copper (0.5 to not more than 5 μm), followed by at least one further layer of copper or silver, each individual layer being 15 to 150 μm thick and the applied layers having a total thickness of 16 to 160 μm. The purpose of the thin copper layer applied first is likewise to improve the adhesion of the subsequent layers to the metallized ceramics. Independently of whether the first thin layer is composed of nickel or copper, under the soldering conditions the process results, at least locally, in the formation of a homogeneous copper/silver alloy. The properties of such alloys, which depend on the Cu/Ag ratio, are known.

It is also possible, however, to make the copper layer applied first thicker (layer thickness 5 to 70 μm, especially 10 to 70 μm) or to produce a first layer of silver of the same thickness, followed in both cases by 10 at least one further layer of copper or silver (individual layer thickness 1 to 70 μm), a total thickness of 15 to 300 μm being aimed at. A maximum total thickness of 200 is better, 140 better still, especially a maximum thickness of 100 μm. If it is desired for the solder to be pure copper, it is necessary to introduce a pre-copperplating and post-copperplating process in the operation. The same is valid for a coating exclusively with Ag.

By incorporating small amounts of nickel, the melting point of the applied layer system can be raised. If the coating is composed of at least a single layer each of silver, copper and nickel (and the coating contains not more than 10 % by weight of nickel), it is possible for the melting point of the three-component system resulting from the soldering to reach not more than 1100° C. The solder 67 Ag 28 Cu 5 Ni has an operating temperature of 850° C.

Independently of the layer applied first (Ag, Cu, Ni), the weight ratio Ag/Cu of the total of the applied layers can be 0:100–100:0. Silver and copper are preferably used, however, at the weight ratios Ag/Cu of 5:100 to 90:10, in particular 85:15 to 50:50. Ratios approaching the eutectic (Ag/Cu 72:28) of 75:25 to 70:30 are particularly preferred because of the low melting points.

When the only metals applied for the coating are silver and copper, it is advantageous for the layer applied first to be copper and the layer applied last, which forms the outer surface, to be silver. In this case the good adhesion of the copper is linked with the good oxidation resistance of the silver. The optimum layer thickness range for the solder Ag/Cu is in this case in the range of 30 to 100 μm. At greater thicknesses adhesion is slightly reduced.

By using these weight ratios it is possible to achieve coatings which on heating form solders having a melting point below 1000° C.

If a ceramic part can be successfully metallized by known processes, then it is possible for a solder to be deposited in layers by the process according to the invention as well. This is especially true for metallized ceramics composed of aluminum oxide, forsterite, steatite and zirconium oxide.

The metallization of aluminum oxide ceramics is known (cf. for example)
1. Cole, S. S. and G. Sommer, Glass-Migration Mechanisms of Ceramic-to-Metal Seal Adherence, J. Am. Ceram. Soc, Vol. 44 No. 6, p. 265-271
2. Fulrath, R. M. and E. L. Hollar, Manganese Glass-Molybdenum Metallizing Ceramics, Ceramic Bulletin, Vol. 47 5 (1968 493–497
3. Klomp. J. T. and Th. P. J. Botden, Sealing Pure Aluminia Ceramics to Metals, Ceramic Bulletin, vol. 49, No. 2 (1970), p. 204–211
4. Cowan, R. E. and S. D. Stoddard, Tungsten Metallizing Aluminia-Yttria Ceramics, Report LA-6705-MS, Los Alamos, New Mexico (1977)
5. Meyer, A., Zum Haftmechanismus von Molybdän/ManganMetallisierungsschiechten auf Korundkeramik[Adhesion Mechanism of Molybdenum/Manganese Metallizing Layers on Corundum Ceramics], Ber. DKG, Vol. 42 (1965), No. 11, p. 405–444).

In the majority of cases the metallizing layer comprises molybdenum, tungsten, tungsten/titanium dioxide or molybdenum/manganese. Expediently, the layers of the solder metal applied successively are in each case composed of different metals. If two identical metals are applied successively, generally only a single layer can be identified later.

Processes for depositing the pure metals Ni, Cu, Ag, Zn and Sn in the form of layers in a galvanic or currentless manner on conducting substrate materials are known to the expert. Baths which allow this deposition to be carried out currentlessly or, especially, galvanically, are commercially available. Purification of the substrate materials and their activation (in the case of currentless metal deposition) are known to a person skilled in the art of electroplating.

In practice it is easier to follow the progress of the deposition by measuring the increase in thickness of the deposited layers than by weighing. The ratio of the layer thicknesses of the metals can, however, be readily calculated from the known phase diagrams for an aimed-for multi-substance system and from the thickness of the metals.

In the galvanic deposition of several layers of different materials for the purpose of forming hard solder alloys, the order of deposition is material for the alloy formation proper. The sequence of layers is preferably chosen such that a galvanotechnically expedient processing technique can be used or the most corrosionresistant layer is deposited last.

By the process according to the invention a ceramic part can be obtained on which are arranged successively from the inside to the outside
a) a thin metallizing layer of tungsten or tungsten/titanium dioxide, molybdenum or molybdenum/manganese,
b) a 0.5 to 5 μm thick layer of nickel or a 1 to 70 μm thick layer of copper or silver, followed by
c) at least one further layer of copper or silver 1 to 70 μm thick with good adhesion, the layers located on the metallizing layer having a total layer thickness of 15 to 150 μm.

The electronics industry frequently has need for ceramic parts which are in the shape of hollow cylinders and which have at least one annular front end or at least one sleeve-shaped jacket zone in the proximity of the annular area metallized for later soldering. Hollow cylinders, the outer diameter of which is not more than 20 mm, in particular not more than 12 mm, and are not more than 20 μm long, are used especially frequently. The internal diameter is at least 3.5 mm, the wall thickness at least 0.8 mm. By the process according to the invention, it is easily possible even in these cases to cover the metallizing layers by layers of solder.

The invention further relates to a process for soldering a metallized ceramic part to a metal object, in which process a hard solder whose melting point is lower than that of the metal object, is introduced between the metallized ceramic part and the metal object, the system comprising the metallized ceramic part, the hard solder and the metal object is heated to a temperature which is above the melting point of the hard solder but below the melting point of the metal object, and the system comprising the molten solder, the metallized ceramic part and the metal object is cooled to a temperature below the melting point of the solder. In this way the hard solder is first brought into contact with the ceramic part in the manner described and the part of the ceramic surface in contact with the metal object and coated by the hard solder is heated.

Examples of suitable metal parts are those made of iron and iron alloys, for example iron-nickel materials, especially Vacodil (material no. 1.3917), iron-nickel-cobalt materials, especially Vacon (material no. 1.3981, 1.3982) or copper and copper alloys, for example zirconium copper, tungsten, molybdenum, niobium and tantalum. All these metals are thoroughly wetted by solders composed of AgCu or AgCuNi.

To enhance the adhesion of the metal-ceramic bond it is an advantage if the solder, and the ceramic and metal components of the system have similar coefficients of expansion. In respect of their resistance to mechanical stresses, soldered joints produced by cutting are superior to end-to-end soldered joints.

The invention is explained in greater detail by the examples.

EXAMPLE 1

Aluminum oxide ceramic parts which have been partly metallized, are galvanically coated by nickel. In this way a nickel layer of about 3 $\mu$m is deposited on the metallizing layer. After intermediate rinsing, 40 $\mu$m of silver are electrodeposited. In order to solder the ceramic part to a copper sheet, it is brought into contact with the copper part in a soldering jig made of graphite and heated to 961° C. A eutectic having a melting point of about 780° C. forms in the proximity of the copper sheet. The copper sheet is bonded to the ceramic part with good adhesion.

EXAMPLE 2

An aluminum oxide ceramic part which has been metallized, is chemically coated by a 4 $\mu$m copper layer. Subsequently about 16 $\mu$m of copper and about 34 $\mu$m of silver are electrodeposited.

The coated ceramic part is brought into contact with a metal part made of Vacon and is heated in a protective gas atmosphere to a soldering temperature of 800° C. In this process the eutectic Cu/Ag which still takes up excess Ag, is first formed on the layer boundary Cu/Ag. After cooling the ceramic part and the metal part forms a vacuum-tight soldered joint with good adhesion.

EXAMPLE 3

Several $Al_2O_3$ hollow cylinders (internal diameter 6 mm, external diameter 7.5 mm) are metallized with Mo/Mn and coated with copper (12 $\mu$m). A silver layer 9 to 17 $\mu$m thick is then electrodeposited. Finally a cone-shaped cap made of Vacon is soldered to the front face of each hollow cylinder by heating to 830° C. The soldered hollow cylinders are vacuum-tight. The adhesion of the cap to the ceramic part exhibits a maximum of about 900 N, depending on the thickness of the silver layer. At 9 and 15 $\mu$m of Ag, the adhesion is about 825 N, at 11 and 13 $\mu$m of Ag about 880 N and at 17 $\mu$m of Ag only about 700 N.

On the other hand, if a conventional process is used (a 3 $\mu$m nickel-plated layer; an Ag/Cu disk of solder with a 72/28 composition), the adhesion is about 800 N, independent of the thickness of the solder layer.

We claim:
1. A process for applying a solder to a metallized ceramic part, comprising the steps of:
   (a) applying a layer of copper galvanically or chemically to the metallized ceramic part in a thickness of 5 to 20 $\mu$m and subsequently
   (b) applying a layer of silver galvanically or chemically in a thickness of from 5 to 20 $\mu$m, wherein a total layer thickness of from 30 to 100 $\mu$m is obtained.
2. A process as claimed in claim 1, wherein the solder is applied to a metallized ceramic part based on aluminum oxide or steatite.
3. A process as claimed in claim 1, wherein the metallizing layer of the ceramic part is composed of molybdenum, molybdenum/manganese, tungsten or tungsten/titanium dioxide.
4. A process as claimed in claim 1, wherein the total of the applied weights of silver and copper are in the ratio 5:100 to 90:10.
5. A process as claimed in claim 4, wherein said ratio is 85:15 to 50:50.
6. A process as claimed in claim 1, wherein said layer of copper is applied in a thickness of 12 $\mu$m and said layer of silver is applied in a thickness of from 9 to 15 $\mu$m.
7. A process as claimed in claim 1, wherein said layer of copper is applied in a thickness of about 10 to 20 $\mu$m.
8. A process as claimed in claim 1, consisting essentially of the recited steps.
9. A process for soldering a metallized ceramic part to a metal object, comprising the steps of:
   (a) applying to said metallized ceramic part a hard solder whose melting point is lower than that of the metal object by
      (i) applying a layer of copper galvanically or chemically to said metallized ceramic part in a thickness of 5 to 20 $\mu$m and subsequently
      (ii) applying a layer of silver galvanically or chemically in a thickness of from 5 to 20 $\mu$m, wherein a total layer thickness of from 30 to 100 $\mu$m is obtained,
   (b) heating the ceramic part thus coated with said solder,
   (c) bringing the coated ceramic part and the metal part into contact without application of pressure,
   (d) heating the system comprising the metallized ceramic part, the hard solder and the metal object to a temperature which is above the melting point of the hard solder but below the melting point of the metal object, and
   (e) cooling the system comprising the molten solder, the metallized ceramic part and the metal object to a temperature below the melting point of the solder.
10. A process as claimed in claim 5, wherein said ratio is 75:25 to 70:30.

11. A process as claimed in claim 10, wherein the said ratio is 72:28.

12. A process as claimed in claim 9, wherein said layer of copper is applied in a thickness of 12 μm and said layer of silver is applied in a thickness of from 9 to 15 μm.

13. A process as claimed in claim 9, wherein said copper layer is applied in a thickness of about 10 to 20 μm.

14. A process as claimed in claim 9, wherein said layer of copper is applied in a thickness of at least 5 μm, said layer of silver is applied in a thickness of at least 5 μm, and the adhesion strength of said solder layer is greater than 51 Nlmm².

15. A process as claimed in claim 9, consisting essentially of the recited steps.

16. A process for applying a solder to a metallized ceramic part, comprising the steps of:
   (a) applying a layer of copper galvanically or chemically to the metallized ceramic part in a thickness of more than about 5 μm and not more than 60 μm and subsequently
   (b) applying a layer of silver galvanically or chemically in a thickness of from 5 to 60 μm, wherein a total layer thickness of 30 μm is obtained.

17. A process for soldering a metallized ceramic part to a metal object, comprising the steps of:
   (a) applying to said metallized ceramic part a hard solder whose melting point is lower than that of the metal object by
      (i) applying a layer of copper galvanically or chemically to said metallized ceramic part in a thickness of more than about 5 μm and not more than 60 μm and subsequently
      (ii) applying a layer of silver galvanically or chemically in a thickness of from 5 to 60 μm, wherein a total layer thickness of 30 μm is obtained,
   (b) heating the ceramic part thus coated with said solder,
   (c) bringing the coated ceramic part and the metal part into contact without application of pressure,
   (d) heating the system comprising the metallized ceramic part, the hard solder and the metal object to a temperature which is above the melting point of the hard solder but below the melting point of the metal object, and
   (e) cooling the system comprising the molten solder, the metallized ceramic part and the metal object to a temperature below the melting point of the solder.

* * * * *